United States Patent [19]
Pelc et al.

[11] Patent Number: 5,399,970
[45] Date of Patent: Mar. 21, 1995

[54] PHASE-CONTRAST MRI USING PHASED-ARRAY MULTICOIL

[75] Inventors: Norbert J. Pelc, Los Altos; Thomas J. Brosnan, Mountain View, both of Calif.

[73] Assignee: Board of Trustees of the Leland Stanford Junior University, Palo Alto, Calif.

[21] Appl. No.: 104,751

[22] Filed: Aug. 11, 1993

[51] Int. Cl.⁶ ............................................. G01V 3/00
[52] U.S. Cl. ................................... 324/309; 324/307
[58] Field of Search ............... 324/300, 307, 309, 318, 324/322; 128/653.2, 653.3

[56] References Cited

U.S. PATENT DOCUMENTS

| | | | |
|---|---|---|---|
| 4,871,967 | 10/1989 | Rotem et al. | 324/309 |
| 4,912,413 | 3/1990 | De Meester et al. | 324/309 |
| 5,086,275 | 2/1992 | Roemer | 324/309 |
| 5,160,891 | 11/1992 | Keren | 324/318 |
| 5,280,246 | 1/1994 | Takahashi et al. | 324/318 |

OTHER PUBLICATIONS

Pelc et al., "Phase Contrast Cine Magnetic Resonance Imaging," Magnetic Resonance Quarterly, vol. 7, No. 4, pp. 229–254, 1991 Raven Press, Ltd., New York.

Hayes et al., "Noise Correlations in Data Simultaneously Acquired from Multiple Surface Coil Arrays," Magnetic Resonance in Medicine, vol. 16, pp. 181–191 (1990).

Roemer et al., "The NMR Phased Array," Magnetic Resonance in Medicine, vol. 16, pp. 192–225 (1990).

Hayes et al., "Volume Imaging with MR Phased Arrays," Magnetic Resonance in Medicine, vol. 18, pp. 309–319 (1991).

*Primary Examiner*—Louis Arana
*Attorney, Agent, or Firm*—Townsend and Townsend Khourie and Crew

[57] ABSTRACT

MRI signals detected by a phased array of multicoils are combined to provide phase contrast image signals with improved signal-to-noise ratio. Detected complex image signals are obtained for different magnetic gradients and are combined to obtain phase, magnitude, and magnitude weighted image signals for imaging.

18 Claims, 2 Drawing Sheets

PHASE-CONTRAST MRI USING PHASED-ARRAY MULTICOIL

BACKGROUND OF THE INVENTION

This invention relates generally to phase contrast magnetic resonance imaging (MRI), and more particularly the invention relates to phase contrast MRI using a multicoil phased array for magnetic resonance signal detection.

As described by Pelc et al. ("Phase Contrast Cine Magnetic Resonance Imaging" Magnetic Resonance Quarterly Vol. 7 No. 4, pp. 229-254, 1991), phase contrast MRI refers to a family of MR imaging methods that exploit the fact that spins that move through magnetic field gradients obtain a different phase than static spins, enabling the production of images with controlled sensitivity to flow. Among the advantages of phase contrast MRI are its adjustable sensitivity to flow and, in some cases, the quantitative nature of the resulting data. In the most common method, two data sets are acquired with a different gradient first moment in one direction, and the pixel by pixel phase difference $\Delta\phi$ in the resulting images is used to measure the velocity, V, in the direction of the gradient change: $\Delta\phi = \gamma \Delta M_1 V$, where $\Delta M_1$ is the change in gradient first moment and $\gamma$ is the gyromagnetic ratio. Four measurements can be used to measure all components of velocity. Sometimes, for aesthetic reasons related to the very high noise in $\Delta\phi$ in regions of low signal, "magnitude weighted" or "magnitude masked" velocity images with pixel intensities proportional to $M\Delta\phi$ are produced, where M is the magnitude image.

Phased array multicoils can be used in MRI to improve the signal-to-noise ratio (SNR) of images. See, for example, Roemer et al. "The NMR Phased Array" Magnetic Resonance in Medicine, Vol. 16, pp. 192-225, 1990; Hayes et al. "Noise Correlations in Data Simultaneously Acquired from Multiple Surface Coil Arrays" Magnetic Resonance in Medicine, Vol. 16, pp. 181-191, 1990; and Hayes et al. "Volume Imaging with MR Phased Arrays" Magnetic Resonance in Medicine, Vol. 18, pp. 309-319, 1991. Basically, the multicoils allow large field of view imaging with the SNR of a small surface coil. Separate images are acquired and reconstructed from each of the elements in the multicoil array. These separate images are then combined into a single image, with each coil dominating the spatial regions where its SNR is the highest. Although various algorithms for this combination process have been proposed, the most commonly used methods use the magnitude of the pixel values in the individual images. For example, one very common method forms images as the square root of the sum of squares of the individual images.

The combination of phase contrast techniques and phased array coils would be very desirable in order to improve the SNR of the velocity-sensitive images. However, a simple and efficient method for combining the information received from the various coils that retains a proportionality with velocity is needed.

SUMMARY OF THE INVENTION

In accordance with the invention, the complex image data ($Z_i$) from each coil (i) in a multicoil phased array including the magnitude ($M_i$) and the phase ($\phi_i$) are employed along with specific coil gain factors ($W_i$) to generate phase, magnitude, and magnitude-weighted images.

More particularly, let $Z_{1i}$ and $Z_{2i}$ be the complex images reconstructed from coil i with sequences 1 and 2, and magnitude image, $M_i$, equal $$M_i = (|Z_{1i}| + |Z_{2i}|)/2$$

and phase image, $\phi_i$, equal $$\phi_i = \text{phase}(Z_{1i}Z_{2i}^*)$$

where
* indicates the complex conjugate and phase $(Z) = \arctan2(\text{imag}(Z), \text{real}(Z))$.
Further, let $W_i$ be the gain factor for coil i.

Then, in accordance with the invention, the phase, magnitude, and magnitude-weighted image are given as:

$$M = \sqrt{|C|}$$

$\Delta\phi = \arctan2 (\text{imag}(C), \text{real } (C))$
mag weighted image $= M \Delta\phi$
where
$C = \Sigma[(Z_{1i}Z_{2i}^*)/W_i^2]$.

The invention presents a simpler and more optimal method in using phase contrast MRI with a phased array multicoil than heretofore known.

The invention and objects and features thereof will be more readily apparent from the following detailed description and appended claims when taken with the drawing.

DESCRIPTION OF THE PREFERRED EMBODIMENT

Figure 1A:
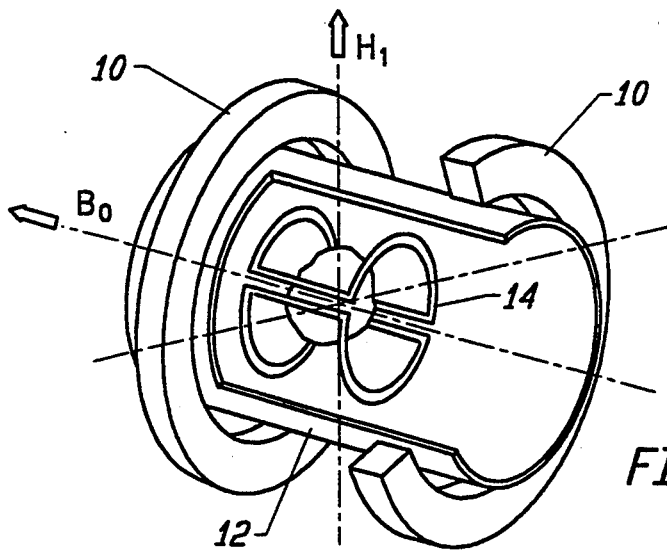
FIGS. 1A-1D illustrate the arrangement of MRI apparatus and magnetic fields generated therein.
Figure 1B:
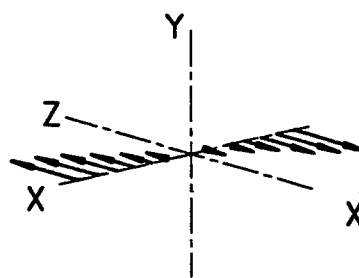
Figure 1C:
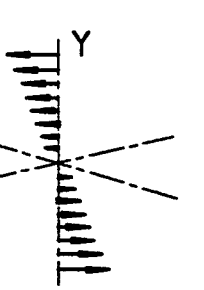
Figure 1D:
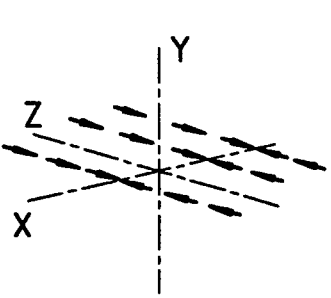

Referring now to the drawings, FIG. 1A is a perspective view, partially in section, illustrating coil apparatus in MR imaging system and FIGS. 1B-1D illustrate field gradients which can be produced in the apparatus of FIG. 1A. Briefly, the uniform static field $B_0$ is generated by the magnet comprising the coil pair 10. A gradient field G(x) is generated by a complex gradient coil set which can be wound on the cylinder 12. An RF field $B_1$ is generated by a saddle coil 14. A patient undergoing imaging would be positioned along the Z axis within the saddle coil. In FIG. 1B an X gradient field is shown which is parallel to the static field $B_0$ and varies linearly with distance along the X axis but does not vary with distance along the Y or Z axes. FIGS. 1C and 1D are similar representations of the Y gradient and Z gradients fields, respectively.

Figure 2:
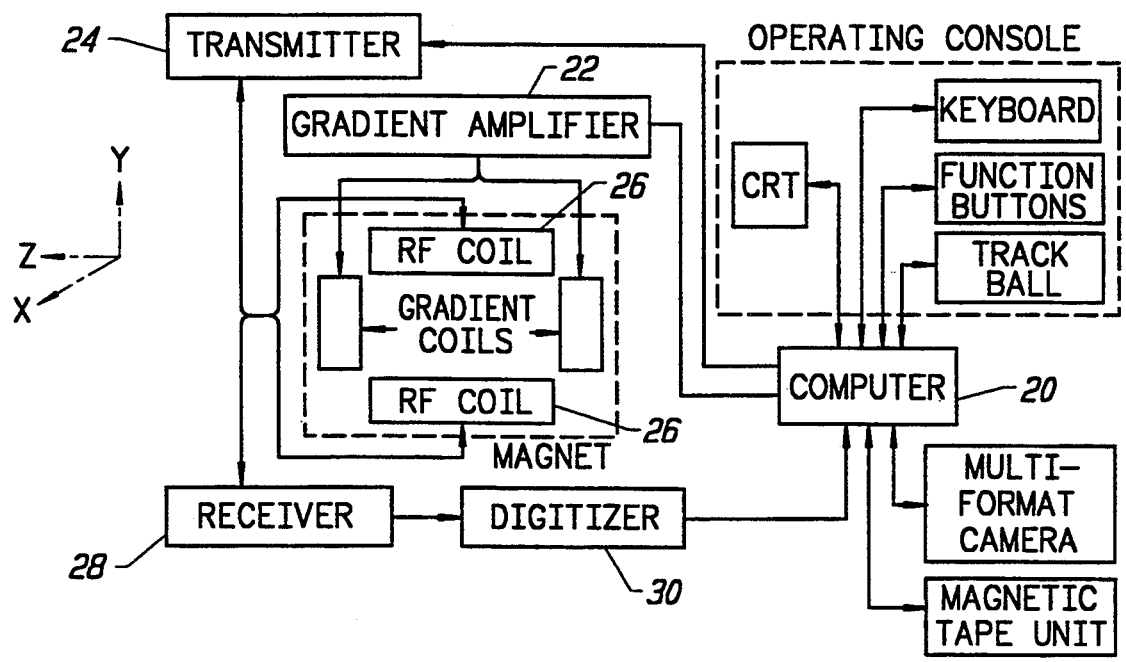
FIG. 2 is a function block diagram of MR imaging apparatus.

FIG. 2 is a functional block diagram of conventional imaging apparatus. A computer 20 was programmed to control the operation of the MRI apparatus and process FID signals detected therefrom. The gradient field is energized by a gradient amplifier 22 and the RF coils for impressing an RF magnetic moment at the Larmor frequency is controlled by the transmitter 24 and the RF coils 26. After the selected nuclei have been flipped, the RF coils 26 are employed to detect the FID signal which is passed through the receiver 28 and then through digitizer 30 for processing by computer 20.

Figure 3:
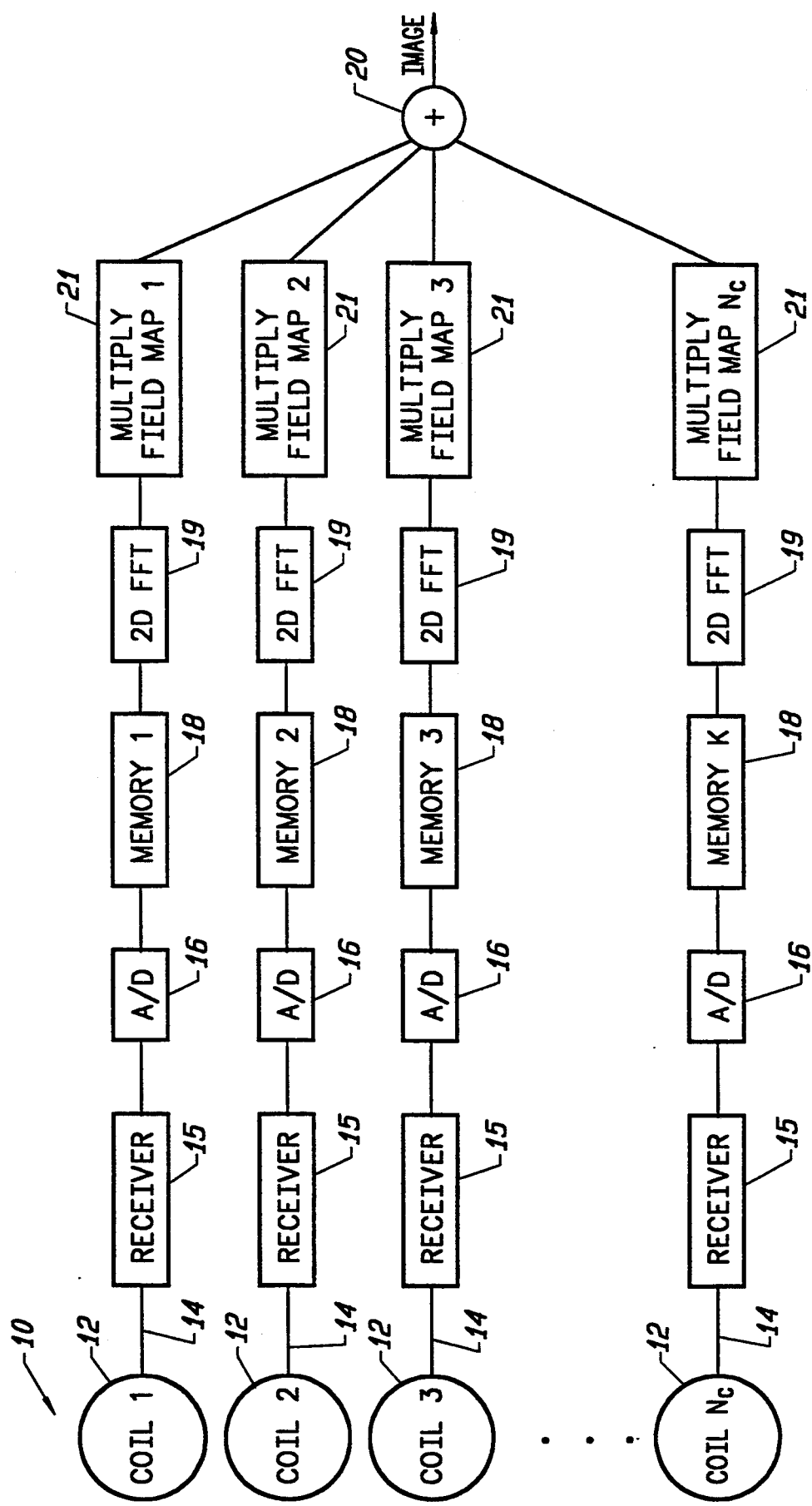
FIG. 3 is a schematic view of an MRI phased array as used in NMR apparatus.

FIG. 3 is a schematic representation of a conventional phased array for use in MRI, as disclosed in Roemer U.S. Pat. No. 5,086,275. The NMR phased array 10 includes a plurality of radio frequency (RF) receiver coils 12 (coils 1 through $N_c$) defining an imaging volume for the NMR imaging of a sample, such as for the NMR medical diagnostic imaging of a human spine. The separate surface coils 12 are identically configured and are arranged in closely spaced relationship with overlapping field of view (FOV), but with substantially no interaction between adjacent coils. The coils 12 are adapted as part of NMR imaging apparatus such as shown in FIGS. 1 and 2, to simultaneously receive a different one of a plurality of NMR response signals, each evoked from an associated portion of the sample enclosed in the imaging volume. As shown, each coil 12 has its own processing channel 14 including receiver circuitry 15 and an analog to digital converter 16. This data processing setup provides for constructing a different NMR image for each channel 14 of a sample portion from the NMR response signals received by the associated coil 12 for that channel 14, and for subsequently combining the plurality of different images thus constructed, on a point by point basis, in the image domain, to produce a single, final NMR image of all sample portions from which an NMR signal was received by any of the coils 12. As further described by Roemer, the optimal combination or weighting of signals from the individual coils 1–$N_c$ in the array 10 to achieve high signal-to-noise ratio (SNR) is dependent on the location of a particular volume element (voxel). This is because the signal of each RF receiving coil $C_i$ is sensitive to nuclear spins in proportion to the field $B_i$ created by the coil, whereas the noise is "white noise" uniformly distributed over the image. Hence, the resultant SNR is a function of position.

As noted above, phase contrast magnetic resonance imaging (MRI) uses flow dependent contrast to produce images. In the most common method, two data sets are acquired with a different gradient first moment in one direction and the pixel by pixel phase difference $\Delta\phi$ in the resulting images is used to measure the velocity V in the direction of the gradient change: $\Delta\phi = \gamma \Delta M_1 V$, where $\Delta M_1$ is a changing gradient first moment and $\gamma$ is the magnetic ratio.

In accordance with the invention, a simple and efficient method is provided for combining the information received from the multicoils that retains the proportionality with velocity.

Consider now phase contrast imaging of a single velocity component (two measurements) and let $Z_{1i}$ and $Z_{2i}$ be the complex images reconstructed from coil i with sequences 1 and 2. Similarly, let $$M_i = (|Z_{1i}| + |Z_{2i}|)/2$$

$$\phi_i = \text{phase}(Z_{1i} Z_{2i}^*)$$

be the magnitude and phase images from coil i, where * indicates the complex conjugate and
phase(Z) = arctan2(imag(Z), real(Z)).
The set $\{\phi_i\}$ can be thought of as estimates of the true velocity induced phase shift $\Delta\phi$. As long as the coils are uncoupled the noise in $\{\phi_i\}$ are uncorrelated but have different variances. The variance in $\phi_i$, $\sigma_i^2$, is inversely proportional to $M_i^2$:

$$\sigma_i^2 \alpha \frac{1}{M_i^2/W_i^2}$$

The linear combination of $\{\phi_i\}$ which minimizes the variance uses a weight for coil i which is inversely proportional to $\sigma_i^2$. Thus one improved algorithm for estimating $\Delta\phi$ is:

$$\Delta\phi = \frac{\Sigma M_i^2 \phi_i / W_i^2}{\Sigma M_i^2 / W_i^2}$$

A magnitude weighted image is formed as $M\Delta\phi$ with:

$$M = \sqrt{\Sigma M_i^2 / W_i^2}$$

Note that the last equation is the conventional magnitude multicoil image. The magnitude weighted phase image is:

$$M\Delta\phi = \frac{\Sigma M_i^2 \phi_i / W_i^2}{\sqrt{\Sigma M_i^2 / W_i^2}}$$

This method requires calculating a separate magnitude and phase shift (arc tangent) image for each coil.

An alternate and preferred method combines the data from the multiple coils prior to the arc tangent. Each complex image, e.g., $Z_{1i}$, contains phase shifts from sources other than the desired velocity component. These undesired phase shifts are also contained in $Z_{2i}$, so that the phase in $Z_{1i}/Z_{2i}$ is, ideally, due only to the desired motion. The phase of $(Z_{1i} Z_{2i}^*)$ is exactly the same. For this reason, as well as computational efficiency and automatic mapping into a $2\pi$ range, the above equation for $\phi_i$ is often used to compute the phase shift. The quantity $(Z_{1i} Z_{2i})$ is a unit vector in the direction $\phi_i$ multiplied by (approximately) $M_i^2$. Each coil provides a similar vector, and, except for noise, all point in the same direction: $\Delta\phi$. Thus, $(Z_{i1} Z_{2i}^*)$ can be viewed as a scaled (weighted) estimate of $e^{i\Delta\phi}$. One might therefore ask: what is the ideal linear combination of multiple estimates of $e^{i\Delta\phi}$. To first order, the estimates should have weights proportional to $M_i^2/W_i^2$. Thus we form:

$$C = \Sigma[(Z_{1i} Z_{2i}^*)/W_i^2]$$

$$M = \sqrt{|C|}$$

| | |
|---|---|
| $\Delta\Phi$ = arctan (imag(C), real(C)) | (11b) |
| mag weighted image = $M \Delta\phi$ | (11c) |

There have been described methods and apparatus for phase contrast MRI with a phased array multicoil in which the information from the various coils can be combined while retaining the proportionality with velocity. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. In a multicoil magnetic resonance imaging system, a method combining signals detected by multicoils for phase-contrast imaging comprising the steps of
   a) detecting complex image signals $Z_{1i}$ and $Z_{2i}$ with each coil, i, in two excitation sequences with different magnetic gradients,
   b) obtaining a combined image C, as the summation of $(Z_{1i}Z_{2i}*)/W_i^2$ where
   $Z_{2i}*$ is the complex conjugate of $Z_{2i}$
   $W_i$ is a gain factor for coil, i; and
   c) forming an output image dependent on C.

2. The method as defined by claim 1 and further including the step:
   d) obtaining phase, $\phi$, magnitude, M, and magnitude weighted image, $M\Delta\phi$, as follows:
   $$M = \sqrt{|C|}$$
   $\Delta\phi = \text{arctan2 [imag}(C), \text{real}(C)]$.

3. The method as defined by claim 1 and further including the step of imaging velocity in a region using said combined image.

4. The method as defined by claim 3 wherein said magnetic gradients vary in one direction and said velocity is in the direction of gradient change.

5. The method as defined by claim 1 and further including the steps of detecting two additional complex image signals, $Z_{3i}$ and $Z_{4i}$, and said magnetic gradients vary in three dimensions, said complex image signals providing components of velocity in said three dimensions.

6. In apparatus for phase-contrast magnetic resonance imaging, the combination comprising:
   a) means for generating a magnetic field,
   b) means for generating at least one magnetic gradient field,
   c) multicoils for detecting complex image signals $Z_{1i}$ and $Z_{2i}$ with each coil, i, in two excitation sequences with different magnetic gradients; and
   d) means for obtaining a combined image C, as the summation of $(Z_{1i}Z_{2i}*)/W_i^2$ where
   $Z_{2i}*$ is the complex conjugate of $Z_{2i}$
   $W_i$ is a gain factor for coil, i; and
   e) means for forming an output image dependent on C.

7. The combination as defined by claim 6 and further including
   f) means for obtaining phase, $\phi$, magnitude, M, and magnitude weighted image, $M\Delta\phi$, as follows:
   $$M = \sqrt{|C|}$$
   $\Delta\phi = \text{arctan2 [imag}(C), \text{real}(C)]$.

8. The combination as defined by claim 6 and further including means for imaging velocity in a region using said combined image.

9. The combination as defined by claim 6 wherein said magnetic gradients vary in one direction and said velocity is in the direction of gradient change.

10. The combination as defined by claim 6 wherein said multicoils detect two additional complex image signals, $Z_{3i}$ and $Z_{4i}$, and said magnetic gradients vary in three dimensions, said complex image signals providing components of velocity in said three dimensions.

11. In a multicoil magnetic resonance imaging system, a method of combining signals detected by multicoils for phase-contrast imaging comprising the steps of
    a) detecting complex image signals $Z_{1i}$ and $Z_{2i}$ with each coil, i, in two excitation sequences with different magnetic gradients,
    b) determining velocity induced phase shift image, $\Delta\phi$, as follows:
    $$\Delta\phi = \frac{\Sigma M_i^2 \phi_i / W_i^2}{\Sigma M_i^2 / W_i^2}$$
    where
    $M_i = (|Z_{1i}| + |Z_{2i}|)/2$
    $\phi_i = \text{phase }(Z_{1i} Z_{2i}*)$
    $* = $ complex conjugate
    $W_i = $ coil gain factor.

12. The method as defined by claim 11 and further determining magnitude weighted phase image as follows:
    $$M\Delta\phi = \frac{\Sigma M_i^2 \phi_i / W_i^2}{\sqrt{\Sigma M_i^2 / W_i^2}}.$$

13. The method as defined by claim 12 and further including the step of imaging velocity in a region using said magnitude weighted phase image.

14. The method as defined by claim 11 and further including the step of imaging velocity in a region using said magnitude multicoil image.

15. The method as defined by claim 11 wherein said magnetic gradients vary in one direction and said velocity is in the direction of gradient change.

16. The method as defined by claim 11 and further including the steps of detecting two additional complex image signals, $Z_{3i}$ and $Z_{4i}$, and said magnetic gradients vary in three dimensions, said complex image signals providing components of velocity in said three dimensions.

17. In apparatus for magnetic resonance imaging, the combination comprising:
    a) means for generating a magnetic field,
    b) means for generating at least one magnetic gradient field,
    c) multicoils for detecting complex image signals $Z_{1i}$ and $Z_{2i}$ with each coil, i, in two excitation sequences with different magnetic gradients, and
    d) means for determining velocity induced phase shift, $\Delta\phi$, and M, magnitude multicoil image, as follows:
    $$M\Delta\phi = \frac{\Sigma M_i^2 \phi_i / W_i^2}{\sqrt{\Sigma M_i^2 / W_i^2}}$$
    where
    $M_i = (|Z_{1i}| + |Z_{2i}|)/2$
    $\phi_i = \text{phase }(Z_{1i} Z_{2i}*)$
    $* = $ complex conjugate
    $W_i = $ coil gain factor.

18. The combination as defined by claim 17 and further including means for imaging velocity in a region using said magnetic multicoil image, M.

* * * * *